(12) United States Patent
Kim

(10) Patent No.: US 7,947,553 B2
(45) Date of Patent: May 24, 2011

(54) METHOD FOR FABRICATING SEMICONDUCTOR DEVICE WITH RECESS GATE

(75) Inventor: Myung-Ok Kim, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 82 days.

(21) Appl. No.: 11/931,510

(22) Filed: Oct. 31, 2007

(65) Prior Publication Data

US 2008/0132074 A1 Jun. 5, 2008

(30) Foreign Application Priority Data

Nov. 6, 2006 (KR) .................. 10-2006-0108820

(51) Int. Cl.
*H01L 27/148* (2006.01)

(52) U.S. Cl. ............. 438/244; 257/E21.651; 438/387

(58) Field of Classification Search ......... 438/243, 438/244, 386, 387; 257/E21.223, E21.396, 257/E21.651

See application file for complete search history.

(56) References Cited

U.S. PATENT DOCUMENTS

| | | | |
|---|---|---|---|
| 4,300,798 A | 11/1981 | Musgrove et al. | |
| 4,300,989 A | 11/1981 | Chang | |
| 5,587,039 A * | 12/1996 | Salimian et al. | 156/345.41 |
| 6,476,444 B1 | 11/2002 | Min | |
| 6,746,925 B1 * | 6/2004 | Lin et al. | 438/287 |
| 7,307,382 B2 * | 12/2007 | Uhlig et al. | 313/506 |
| 7,323,401 B2 * | 1/2008 | Ramaswamy et al. | 438/551 |
| 7,413,941 B2 * | 8/2008 | Zhang et al. | 438/164 |
| 7,504,338 B2 * | 3/2009 | Du et al. | 438/694 |
| 7,521,307 B2 * | 4/2009 | Zhu et al. | 438/199 |
| 2002/0004309 A1 * | 1/2002 | Collins et al. | 438/719 |
| 2003/0045119 A1 * | 3/2003 | Wang et al. | 438/745 |
| 2003/0054629 A1 * | 3/2003 | Kawai et al. | 438/622 |
| 2003/0057184 A1 * | 3/2003 | Yu et al. | 216/79 |
| 2006/0017099 A1 * | 1/2006 | Paik | 257/330 |
| 2006/0113590 A1 * | 6/2006 | Kim et al. | 257/330 |
| 2006/0289931 A1 * | 12/2006 | Kim et al. | 257/330 |
| 2007/0029632 A1 * | 2/2007 | Hausner et al. | 257/434 |
| 2008/0203463 A1 * | 8/2008 | Van Schaijk et al. | 257/320 |
| 2009/0029528 A1 * | 1/2009 | Sanchez et al. | 438/476 |

FOREIGN PATENT DOCUMENTS

| | | |
|---|---|---|
| CN | 1855428 | 12/2009 |
| KR | 1020050062019 | 6/2005 |
| KR | 10-2006-0058959 | 6/2006 |
| KR | 1020060058959 | 6/2006 |
| KR | 1020060083707 | 7/2006 |

(Continued)

OTHER PUBLICATIONS

Office Action dated Nov. 28, 2008, for Chinese application No. 200710165166.9.

(Continued)

*Primary Examiner* — David Vu

(74) *Attorney, Agent, or Firm* — Lowe Hauptman Ham & Berner LLP

(57) ABSTRACT

A method for fabricating a semiconductor device includes forming a first recess in a substrate, forming a plasma oxide layer over the substrate including first recess, etching the plasma oxide layer to have a portion of the plasma oxide layer remain on sidewalls of the first recess, and forming a second recess by isotropically etching a bottom portion of the first recess, wherein the second recess has a width greater than a width of the first recess.

19 Claims, 8 Drawing Sheets

FOREIGN PATENT DOCUMENTS

WO 03/081645 10/2003

OTHER PUBLICATIONS

Translation of Office Action from German Patent and Trademark Office.

Office Action dated Sep. 22, 2009, for Korean application No. 10-2006-0108820.

Korean Notice of Allowance for Korean application No. 10-2006-0108820, citing the attached reference(s).

* cited by examiner

METHOD FOR FABRICATING SEMICONDUCTOR DEVICE WITH RECESS GATE

CROSS-REFERENCE TO RELATED APPLICATIONS

The present invention claims priority of Korean patent application number 10-2006-0108820 filed on Nov. 6, 2006, which is incorporated by reference in its entirety.

BACKGROUND OF THE INVENTION

The present invention relates to a method for fabricating a semiconductor device, and more particularly, to a method for fabricating a semiconductor device including a recess gate.

As semiconductor devices become highly integrated, a channel length of a memory cell transistor decreases. Furthermore, as an ion implantation doping concentration to a substrate increases, junction leakage also increases due to an increasing electric field. Thus, it may be difficult to secure refresh characteristics of a semiconductor device with a typical planar type transistor structure.

Thus, a three-dimensional (3D) recess gate process has been introduced to overcome the above limitations. According to the process, a portion of an active region in a substrate is etched to form a recess increasing the channel length and a gate electrode is formed over the recess.

FIGS. 1A and 1B illustrate micrographic views of a transistor including a typical recess gate. FIG. 1A illustrates a cross-sectional view in a longitudinal direction of an active region and FIG. 1B illustrates a cross-sectional view in a lateral direction of the active region.

Referring to FIG. 1A, an isolation layer 12 is formed in the substrate 11 to define an active region and a recess 13 is formed by selectively etching a portion of the substrate 11 in the active region. The refresh characteristics of a semiconductor device may be secured as the channel length is increased by the recess 13. However, as a design rule of the semiconductor device becomes smaller, a critical dimension (CD) of the recess 13 is getting smaller. Thus, the profile of the recess 13 may be deteriorated as the profile of the bottom of the recess 13 becomes sharp due to decrease of its radius of curvature.

Referring to FIG. 1B, as the profile of the bottom of the recess 13 becomes sharp, a horn 100 is formed on an interface between the isolation layer 12 and the recess 13. Since the horn 100 may become a source of leakage current, the refresh characteristics of the semiconductor device may be deteriorated. Thus, a bulb-type recess gate process has been introduced to overcome the above limitations. According to the process, the bottom of the recess 13 is shaped roundly to increase the radius of curvature.

FIGS. 2A and 2B illustrate a micrographic view of profiles of a typical bulb-type recess gate. FIG. 2A illustrates a cross-sectional view in a longitudinal direction of an active region and FIG. 2B illustrates a cross-sectional view in a lateral direction of the active region.

Referring to FIG. 2A, an isolation layer 22 is formed in a substrate 21 to define an active region and a portion of the active region is selectively etched to form a bulb-type recess region 23. The bulb-type recess region 23 is formed to have a lower portion whose profile is round and wider in longitudinal direction than that of an upper portion of the bulb-type recess region 23.

As shown in FIG. 2B, a horn is not formed on an interface between the isolation layer 22 and the bulb-type recess region 23 due to forming the bulb-type recess region 23.

Meanwhile, forming the bulb-type recess region 23 should be performed as follows. After a first recess (not shown) having a vertical profile is formed by selectively etching the substrate 21, a passivation layer (not shown) is formed over sidewalls of the first recess to protect the sidewalls of the first recess during a subsequent etching process to form a second recess (not shown). The second recess is formed by isotropically etching a bottom of the first recess.

Typically, the passivation layer has been a thermal oxide layer such as a high temperature oxide (HTO) layer or a low pressure tetraethyloxysilane (LPTEOS) layer. When the thermal oxide layer is formed as the passivation layer, it requires a process time more than 5 hours and it is difficult to control a thickness of the thermal oxide layer. Furthermore, when the passivation layer is formed by using the thermal oxide layer, a thickness of the passivation layer on the bottom portion of the first recess may be greater than that on the sidewalls of the first recess, in which case the second recess may not be formed if an etching target thickness of the subsequent etching process is not sufficient to break through the thick oxide layer on the bottom of the first recess.

FIG. 3 illustrates a micrographic view of above problem of typical process using the thermal oxide layer as the passivation layer.

FIGS. 4A and 4B illustrate micrographic views of typical bulb-type recess gates, showing another problem called as a seam (400A and 400B) formed during formation of a gate electrode by filling a polysilicon layer in the recess pattern. Since the second recess is formed by an isotropic etching, it is difficult to control a CD of the second recess. And in case that a thermal oxide layer is used as the passivation layer, it becomes more difficult to control the CD of the second recess due to non-uniform thickness of the thermal oxide layer, which may cause unwanted increase in the CD of the second recess. On one hand, during a subsequent process to form a polysilicon gate electrode, a polysilicon layer having good step coverage is formed along the surface profile of the recess pattern. Therefore, in case that the CD of the second recess is excessively greater than that of the first recess, a space 400A is formed in the second recess, which is called as a seam. As illustrated with a reference numeral 400B in FIG. 4B, the seam 400A moves to an interface between a gate oxide layer and the polysilicon gate electrode during subsequent thermal processes, which deteriorates the refresh characteristics of a semiconductor device.

SUMMARY OF THE INVENTION

The present invention provides a method for fabricating a semiconductor device, and more particularly, a method for fabricating a recess gate in the semiconductor device, thereby improving thickness controllability and increasing process time for an oxide layer used as a passivation layer to form a bulb-type recess region. The method for fabricating the recess gate in the semiconductor device according to the present invention can also prevent deterioration of refresh characteristics of the semiconductor device caused by a seam which is formed in a gate electrode due to an extensive difference between a critical dimension (CD) of a first recess and that of a second recess for the bulb-type recess region and moves to an interface between a gate oxide layer and the gate electrode during a subsequent thermal process.

In accordance with an aspect of the present invention, there is provided a method for forming a recess pattern in a semiconductor device, including: forming a first recess in a substrate, forming a plasma oxide layer over the substrate including the first recess, partially etching the plasma oxide layer to leave a portion of the plasma oxide layer on sidewalls of the first recess, and forming a second recess by isotropically etching a bottom portion of the first recess, wherein the second recess has a width greater than a width of the first recess.

DESCRIPTION OF SPECIFIC EMBODIMENTS

FIGS. 5A to 5G illustrate cross-sectional views of a method for fabricating a transistor with a recess gate in accordance with an embodiment of the present invention.

Figure 1A:
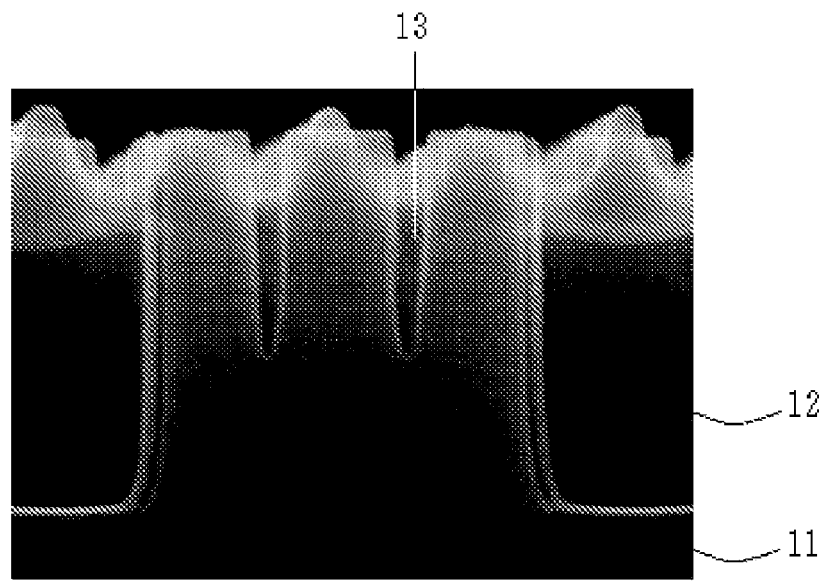
FIGS. 1A and 1B illustrate micrographic views of a transistor including a typical recess gate.
Figure 1B:
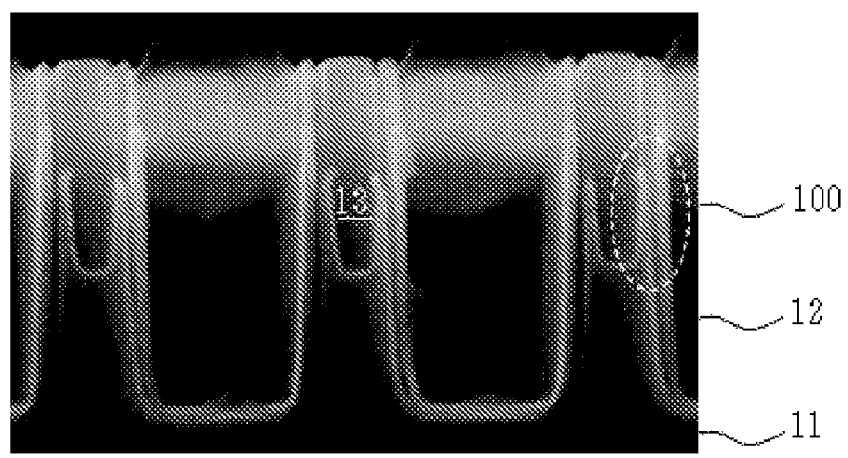
Figure 2A:
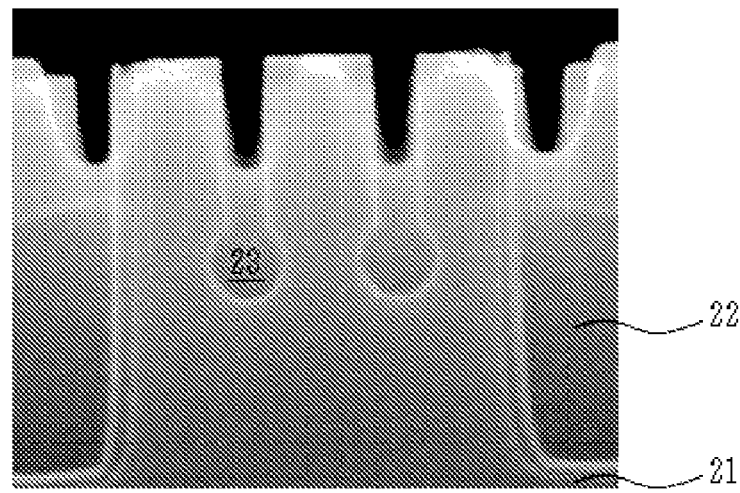
FIGS. 2A and 2B illustrate micrographic views of profiles of a typical bulb-type recess gate.
Figure 2B:
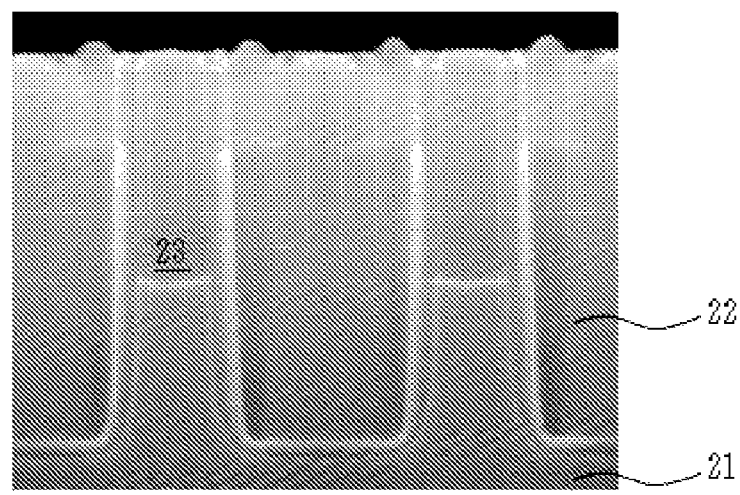
Figure 3:
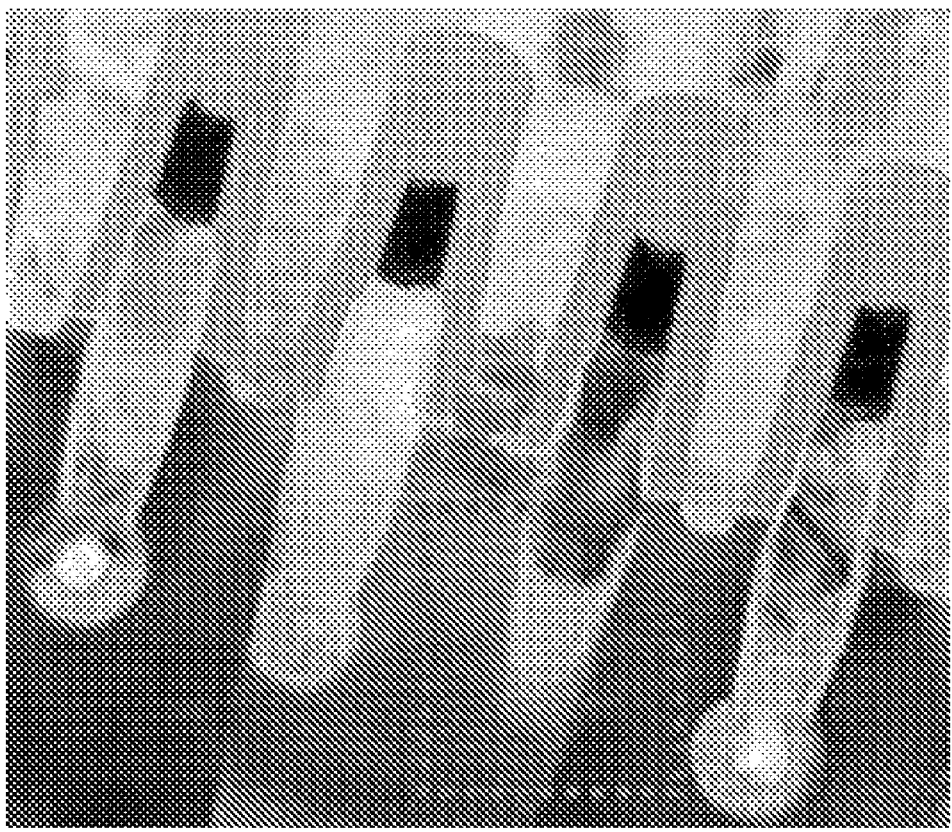
FIG. 3 illustrates a micrographic view of a typical bulb-type recess gate.
Figure 4A:
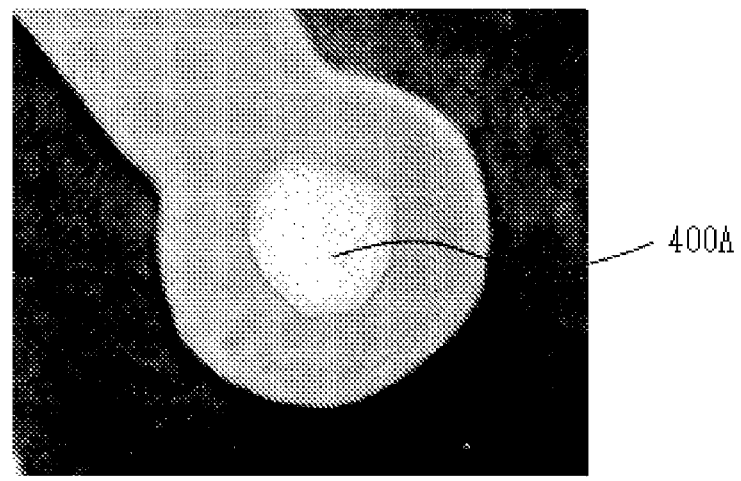
FIGS. 4A and 4B illustrate micrographic views of a typical bulb-type recess gate.
Figure 4B:
Figure 5A:
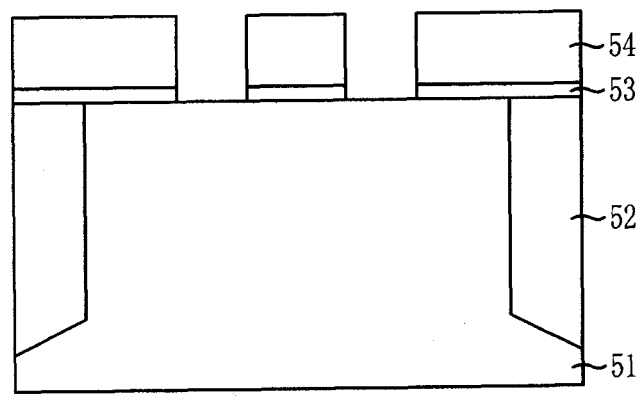
FIGS. 5A to 5G illustrate cross-sectional views of a method for fabricating a transistor with a recess gate in accordance with an embodiment of the present invention.

Referring to FIG. 5A, an isolation layer 52 is formed in a substrate 51 to define an active region. The substrate 51 is selectively etched to form a trench and an insulation layer is formed to fill the trench. The insulation layer is planarized to form the isolation layer 52. A sacrificial oxide layer and a hard mask are successively stacked over the substrate 51 and the isolation layer 52 and a photoresist pattern (not shown) is formed over the hard mask. The hard mask and the sacrificial oxide layer are successively etched by using the photoresist pattern as an etch mask. Thus, a first mask pattern 53 and a second mask pattern 54 are formed to define a recess target region over the substrate 51 and the isolation layer 52.

The first mask pattern 53 protects the substrate 51 from a top attack and can be formed of one selected from a thermal oxide, a high temperature oxide (HTO), a middle temperature oxide (MTO), a low pressure tetraethyloxysilane (LPTEOS), a plasma enhanced tetraethyloxysilane (PETEOS), or a combination thereof. The first mask pattern 53 also can be formed from a pad oxide layer used during a formation of the isolation layer 52. Meanwhile, the first mask pattern 53 has a thickness ranging from approximately 50 Å to approximately 500 Å. The second mask pattern 54 can be formed of one selected from an amorphous carbon, a silicon oxynitride (SiON), a polysilicon or a combination thereof.

Figure 5B:
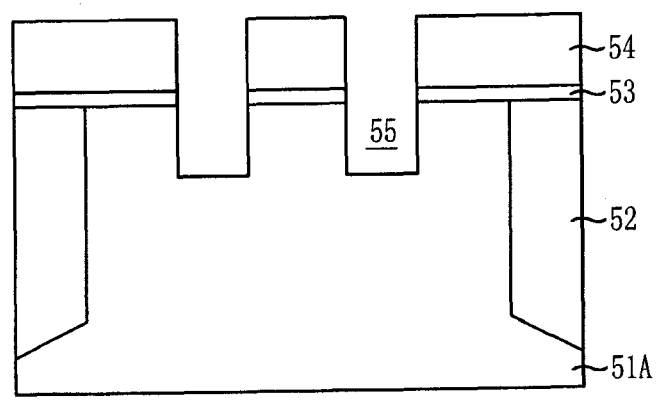

Referring to FIG. 5B, a first recess 55 is formed by etching the substrate 51. The first recess 55 has a vertical profile and acts as a neck of the bulb-type recess region (FIG. 5F). Preferably, the first recess 55 has a depth ranging from approximately 1,000 Å to approximately 2,000 Å. The etching process to form the first and second mask patterns 53 and 54 and the vertical etching process to form the first recess 55 may be performed in-situ in the same chamber or ex-situ in different chambers.

A first cleaning process (not shown) is performed on the first recess 55. The first cleaning process may be performed using sulfuric acid-peroxide mixture (SPM), buffered oxide etchant (BOE) and ammonium hydroxide mixture, successively. Thus, etching residues such as polymer or native oxide formed during the etching process for the first recess 55 can be removed throughout the first cleaning process. Then, the second mask pattern 54 is removed. A reference numeral 51A represents the substrate after the etching process for the first recess 55.

Figure 5C:
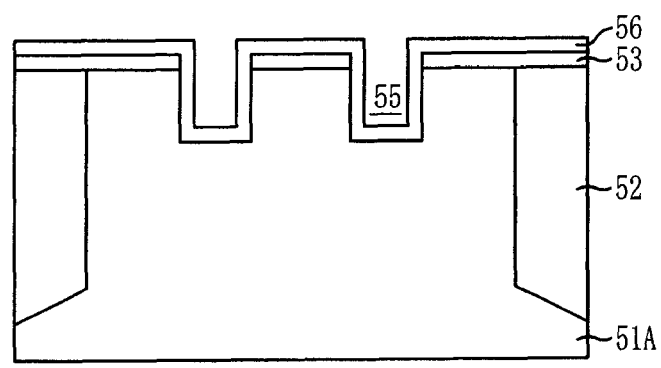

Referring to FIG. 5C, a plasma oxide layer 56 is formed over the trench 55 and the first mask pattern 53. The plasma oxide layer 56 is formed by performing a plasma oxidation in a plasma etch chamber or a photoresist strip chamber. The plasma oxide layer 56 has a thickness ranging from approximately 20 Å to approximately 30 Å. When the plasma oxide layer 56 is formed in the plasma etch chamber, a formation of the plasma oxide layer 56 is performed at a temperature ranging from approximately 30° C. to approximately 300° C.; a pressure ranging from approximately 100 mTorr to approximately 100 Torr; a source power ranging from approximately 300 W to approximately 900 W.

Furthermore, the formation of the plasma oxide layer 56 is performed by using a gas mixture of carbon fluoride ($CF_4$) and oxygen ($O_2$) gases in the plasma etch chamber, wherein a flow ratio of $CF_4$ gas to $O_2$ gas is 1 to 2. Especially, the $CF_4$ gas in the gas mixture has the merits of curing the substrate damaged during the formation of the first recess and restraining formation of a horn between the isolation layer 52 and the first recess 55, when the plasma oxide layer 56 is formed.

When the plasma oxidation is performed in the photoresist strip chamber, the plasma oxide layer 56 can be formed by using a gas mixture of $O_2$ and nitrogen ($N_2$) gases. Preferably, the plasma oxidation should be performed within approximately 30 minutes to 60 minutes after the first cleaning process in order to minimize a growth of a native oxide layer and thereby to maximize the formation of the plasma oxide layer. When the delay time is over 60 minutes, it is difficult to form the plasma oxide layer 56 because the native oxide layer grows. In contrast to more than 5 hours to form the thermal oxide layer, it takes less than approximately 3 minutes per a wafer to form the plasma oxide layer 56. Thus, throughput of the formation of the plasma oxide layer 56 is dramatically decreased. Furthermore, it is much easier to control a thickness of the plasma oxide layer 56 than a thickness of the thermal oxide layer.

Since the plasma oxide layer 56 is uniformly formed over the first recess 55 and the first mask pattern 53, it is easy to control a subsequent etching process to have the plasma oxide layer 56 remain only on the sidewalls of the first recess 55. Therefore, formation of a second recess (FIG. 5E) is secured as an etch target for the second recess is secured. In contrast that the thermal oxide is formed at a temperature approximately 500° C., the plasma oxide layer 56 is sufficiently formed at a temperature ranging from approximately 30° C. to approximately 300° C.

Figure 5D:
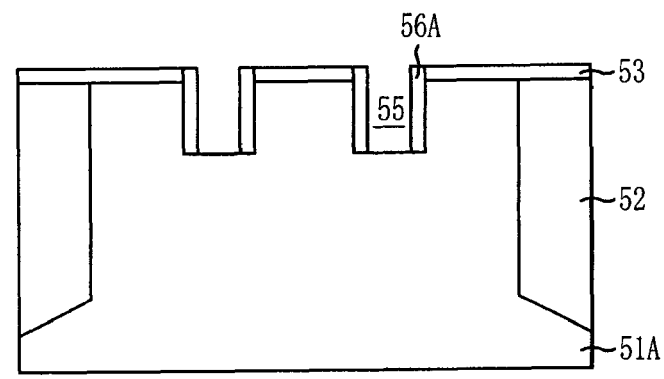

Referring to FIG. 5D, the plasma oxide layer 56 is etched, preferably by an anisotropic etching, so that the plasma oxide layer 56A remains only on the sidewalls of the first recess 55. The plasma oxide layer 56A protects the sidewalls of the first recess 55 during a subsequent second etching process to form the second recess. Preferably, the etching of the plasma oxide layer 56 is performed by using a gas mixture of $CF_4$, $O_2$ and argon (Ar) gases at a pressure ranging from approximately 10 mTorr to approximately 60 mTorr.

Figure 5E:
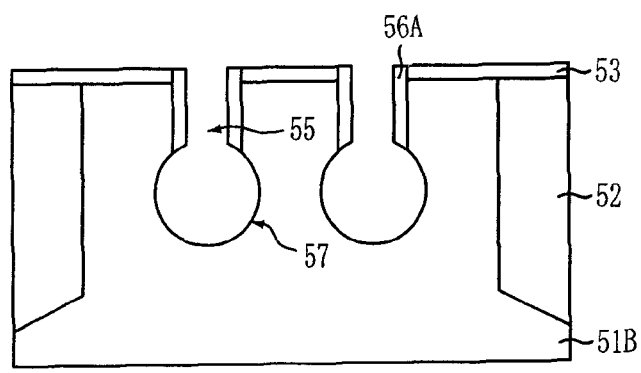
Figure 5F:
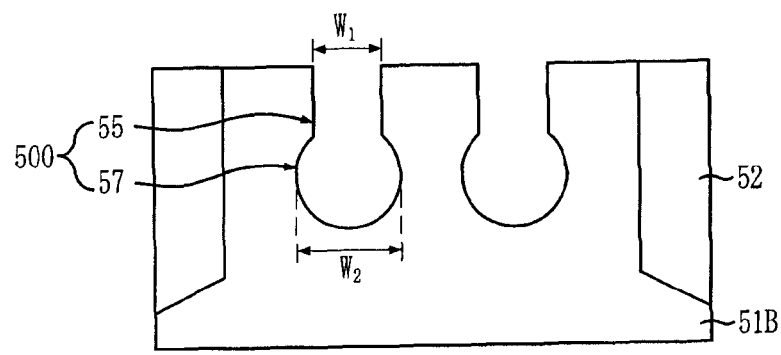

Referring to FIG. 5E, the second recess 57 is formed by performing an isotropic etching on the substrate 51A. By performing the isotropic etching while the plasma oxide layer 56A is protecting the sidewalls of the first recess 55, the second recess 57 is formed to have a round shape so that the width of the second recess 57 is greater than that of the first recess 55. The first mask pattern 53 acts as an etch barrier to protect the substrate 51A during the isotropic etching is performed.

Preferably, the isotropic etching to form the second recess 57 is performed in-situ in the same chamber used for etching the plasma oxide layer 56, under the condition of a top power ranging from approximately 300 W to approximately 1,000 W and either without supplying the bottom power or applying the bottom power ranging from approximately 1 W to approximately 100 W. Furthermore, the isotropic etching is also performed by using one of a hydrobrom (HBr) gas, a chlorine ($Cl_2$) gas, an $O_2$ gas, a sulphur hexafluoride ($SF_6$) gas, a $CF_4$ gas or a combination thereof. A reference numeral 51B represents the substrate after the isotropic etching is performed on the substrate 51A.

Preferably, the second recess 57 is formed to have a width of approximately one time to one and half times of the width of the first recess 55 in the longitudinal direction of the active region. If the width of the second recess is too much greater than that of the first recess, a seam may be formed in a gate electrode (FIG. 5G) during a subsequent formation of the gate electrode, degrading characteristics of a semiconductor device. Thus, the second width should be controlled.

A second cleaning process (not shown) is performed to remove the first mask pattern 53 without removing the plasma oxide layer 56A, by using SPM and ammonia hydroxide ($NH_4OH$), successively. If the second cleaning process is performed by using an etchant such as a buffered oxide etchant (BOE) solution which can remove the plasma oxide layer 56A, the substrate 51B may also sustain a loss, causing unwanted widening of the second recess 57. Therefore, the second cleaning process is performed under a condition that the etched plasma oxide layer 56A is not removed or affected, thereby selectively etching only the residues formed during the isotropic etching for the second recess 57.

Then, a light etch treatment (LET, not shown) is performed by using a gas mixture of $CF_4$ and $O_2$ gases to cure a damaged portion of the substrate 51B affected during the isotropic etching and to remove any horn formed after the formation of the second recess 57. The plasma oxide layer 56A on the sidewalls of the first recess 55 is used as an etched barrier to prevent increase of the CD of the first recess 55 during the LET.

Referring to FIG. 5F, the plasma oxide layer 56A on the sidewall of the first recess is removed by performing a third cleaning process. Small amount of a plasma oxide layer (not shown) formed during the LET may be also removed during the plasma oxide layer 56A is removed.

Thus, the bulb-type recess region 500 including the first recess 55 having the vertical profile and the second recess 57 having a round profile is formed. Reference symbolics $W_1$ and $W_2$ represent the width of the first recess 55 and the width of the second recess 57, respectively. Herein, the width $W_2$ of the second recess 57 is formed one time to one and half times of the width $W_1$ of the first recess 55.

Figure 5G:
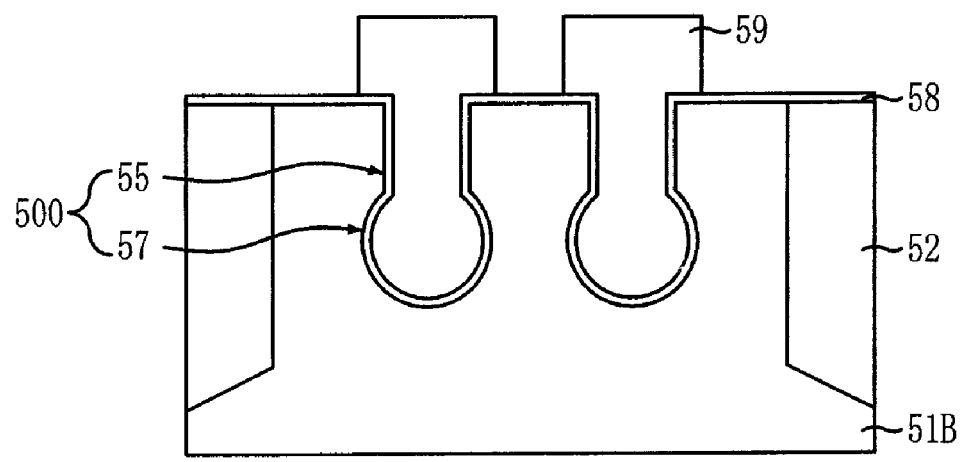

Referring to FIG. 5G, a gate insulation layer 58 is formed over the isotropically etched substrate 51B, the isolation layer 52 and the bulb-type recess region 500. The gate insulation layer 58 is formed of, for example, an oxide layer. A conductive layer is formed over the gate insulation layer 58 to form a gate electrode. The conductive layer is formed as filling the bulb-type recess region 500 and covering the substrate 51B. The conductive layer is formed of, preferably, a polysilicon layer. Subsequently, the conductive layer is patterned to form a gate electrode 59.

Forming the plasma oxide layer 56 to protect the sidewalls of the first recess 55 in accordance with the embodiment of the present invention improves a production yield than forming the thermal oxide layer due to dramatically decreased throughput. Furthermore, the plasma oxide layer 56 forms uniformly and the thickness of the plasma oxide layer 56 is easy to control. It is also easy to control the second recess 57 to have a round profile, the width ($W_2$) of which is one time to one and half times of the width ($W_1$) of the first recess 55. Therefore, a formation of the seam, which is generated during a formation of the conductive layer when a difference between the width $W_2$ of the second region 57 and the width $W_1$ of the first recess 55 is large, can be prevented.

According to above described embodiment of the present invention, a recess gate may apply to dynamic random access memory (DRAM) devices of 50 nm by effectively restraining formation of a horn in a semiconductor substrate and preventing formation of the seam in DRAM devices of 70 nm or less. Accordingly, the refresh characteristics of DRAM devices are improved.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method of fabricating a semiconductor device, said method comprising;
    forming first and second mask patterns on a substrate;
    forming a first recess in a portion of the substrate, said portion being exposed by the first and second mask patterns;
    forming a plasma oxide layer in a plasma chamber, which is a plasma etch chamber or a photoresist strip chamber, over the substrate including the first recess;
    etching the plasma oxide layer to have a portion of the plasma oxide layer remain on sidewalls of the first recess;
    forming a second recess by isotropically etching a bottom portion of the first recess, wherein the second recess has a width greater than a width of the first recess; and
    performing a cleaning step to remove the first mask pattern without removing the plasma oxide layer;
    wherein the method further comprises, before forming the plasma oxide layer, performing a first cleaning step to remove the second mask pattern.

2. The method as recited in claim 1, wherein said forming the plasma oxide layer is performed in the plasma etch chamber and comprises:
    applying a pressure ranging from approximately 100 mTorr to approximately 100 Torr; and
    applying a source power ranging from approximately 300 W to approximately 900 W in the plasma etch chamber.

3. The method as recited in claim 2, wherein said forming the plasma oxide layer uses a carbon fluoride ($CF_4$) gas.

4. The method as recited in claim 2, wherein said forming the plasma oxide layer uses a gas mixture of carbon fluoride ($CF_4$) and oxygen ($O_2$) with a flow ratio of $CF_4$ to $O_2$ gas being 1 to 2.

5. The method as recited in claim 1, wherein said forming the plasma oxide layer is performed in the photoresist strip chamber and comprises using a gas mixture of oxygen ($O_2$) and nitrogen ($N_2$) in the photoresist strip chamber.

6. The method as recited in claim 1, wherein the plasma oxide layer has a thickness ranging from approximately 20 Å to approximately 30 Å.

7. The method as recited in claim 1, wherein said etching the plasma oxide layer and said forming the second recess are performed in-situ in the same chamber.

8. The method as recited in claim 1, wherein the second recess has a width of approximately one time to one and half times of a width of the first recess.

9. The method as recited in claim 1, wherein the isotropic etching is performed in a pressure ranging from approximately 10 mTorr to approximately 60 mTorr and at a top power ranging from approximately 300 W to approximately 1,000 W.

10. The method as recited in claim 9, wherein the isotropic etching is performed without applying a bottom power.

11. The method as recited in claim 9, wherein the isotropic etching is performed by applying a bottom power ranging from approximately 1 W to approximately 100 W.

12. The method as recited in claim 9, wherein the isotropic etching comprises using at least one gas selected from the group consisting of hydrobrom (HBr), chlorine ($Cl_2$), oxygen ($O_2$), sulphur hexafluoride ($SF_6$), and carbon fluoride ($CF_4$).

13. The method as recited in claim 1, wherein the etching of the plasma oxide layer is an anisotropic etching.

14. The method as recited in claim 1, wherein the plasma oxide layer is formed within an hour after performing the first cleaning step.

15. The method as recited in claim 1, wherein the cleaning step to remove the first mask pattern is a second cleaning step and is performed after forming the second recess.

16. The method as recited in claim 15, wherein the method further comprises, after performing the second cleaning step,
performing a light etch treatment (LET) to cure a damaged portion of the substrate due to the isotropic etching and to remove any horn formed after the second recess is formed;
wherein the plasma oxide layer on the sidewalls of the first recess is used as an etch barrier to prevent an increase of a critical dimension of the first recess during the LET.

17. The method as recited in claim 16, wherein the method further comprises, after performing the LET, performing a third cleaning step to remove the plasma oxide layer.

18. A method of fabricating a semiconductor device, said method comprising;
forming a mask pattern on a substrate;
etching a first recess in a portion of the substrate exposed by the mask pattern;
forming a plasma oxide layer over the substrate including the first recess and the mask pattern;
etching the plasma oxide layer to have a portion of the plasma oxide layer remain on sidewalls of the first recess;
forming a second recess by isotropically etching a bottom portion of the first recess, wherein the second recess has a width greater than a width of the first recess;
after said forming the second recess, performing a cleaning step to remove the mask pattern without removing the plasma oxide layer;
after said cleaning step, performing an etch treatment to cure a damaged portion of the substrate due to the isotropic etching and to remove any horn formed after the second recess is formed, wherein the plasma oxide layer on the sidewalls of the first recess is used as an etch barrier to prevent an increase of a critical dimension of the first recess during the etch treatment; and
after the etch treatment, performing a further cleaning step to remove the plasma oxide layer.

19. The method as recited in claim 18, further comprising:
another cleaning step performed after said etching the first recess and before said forming the plasma oxide layer to remove etching residues, which include polymer or native oxide formed when the first recess is etched.

* * * * *